United States Patent
Hayashimoto et al.

(10) Patent No.: US 6,774,420 B2
(45) Date of Patent: Aug. 10, 2004

(54) IMAGE SENSOR

(75) Inventors: Yoshiaki Hayashimoto, Kanagawa (JP); Young-Joo Seo, Buchun-si (KR)

(73) Assignee: Graphic Techno Japan Co., Ltd. (KR)

( * ) Notice: Subject to any disclaimer, the term of this patent is extended or adjusted under 35 U.S.C. 154(b) by 0 days.

(21) Appl. No.: 10/300,036

(22) Filed: Nov. 19, 2002

(65) Prior Publication Data

US 2004/0065908 A1 Apr. 8, 2004

(30) Foreign Application Priority Data

Oct. 4, 2002 (KR) .................... 10-2002-0060468

(51) Int. Cl.$^7$ .............. H01L 31/062; H01L 31/0232; H01L 21/00; H01L 27/00
(52) U.S. Cl. ............ 257/294; 257/290; 257/291; 257/292; 257/293; 257/435; 257/446; 257/461; 438/48; 438/49; 438/70; 438/78; 438/79; 250/208.1; 250/214.1
(58) Field of Search ................... 257/290–294, 257/435, 446, 461, 465; 438/48, 49, 54, 70, 78, 79; 250/208.1, 214.1

(56) References Cited

U.S. PATENT DOCUMENTS

| 6,366,322 B1 | | 4/2002 | Lee et al. ............ 348/314 |
| 6,376,823 B1 | | 4/2002 | Choi ............ 250/208.1 |
| 6,403,998 B1 | * | 6/2002 | Inoue ............ 257/292 |
| 6,455,909 B1 | | 9/2002 | Muramatsu et al. ........ 257/444 |

FOREIGN PATENT DOCUMENTS

EP 0538886 A1 * 4/1993

* cited by examiner

Primary Examiner—Donghee Kang
(74) Attorney, Agent, or Firm—Cantor Colburn LLP

(57) ABSTRACT

An image sensor with improved productivity and sensitivity is provided. The image sensor includes a plurality of unit pixels, each unit pixel including an oxide film formed upon a semiconductor substrate; a gate electrode formed on the oxide film; a photodiode N-type region formed within the semiconductor substrate and interfacing with the oxide film, which is space apart from the gate electrode by a predetermined distance and disposed on one side of the gate electrode; and a floating diffusion region formed within the semiconductor substrate and interfacing with the oxide film, which is spaced apart from the gate electrode by a predetermined distance and is disposed on the other side of the gate electrode.

1 Claim, 4 Drawing Sheets

IMAGE SENSOR

BACKGROUND OF THE INVENTION

1. Field of the Invention

The present invention relates to an image sensor, and more particularly to an image sensor of which productivity and sensitivity are improved.

2. Description of the Related Art

Conventional image sensors are manufactured in a type of charge coupled device (CCD) or complementary metal-oxide-semiconductor (CMOS) image sensor, which are shown in FIGS. 1 and 2.

FIG. 1 is a cross-sectional view showing a structure of a unit pixel in a conventional CCD image sensor.

Referring to FIG. 1, the unit pixel of the conventional CCD image sensor includes: an oxide film 4 formed upon a semiconductor substrate 7; a photodiode N-type region 2 formed within the semiconductor substrate 7 at a predetermined depth; a photodiode surface P-type region 5 disposed on the photodiode N-type region 2 and having an interface with the oxide film 4; a floating diffusion region 3 disposed within the semiconductor substrate 7 and having an interface with the oxide film 4, which is spaced apart from the photodiode surface P-type region 5 by a predetermined distance; a gate electrode 1 disposed on the semiconductor substrate above the floating diffusion region 3; and a P-type well region 6 containing the photodiode N-type region 2, the photodiode surface P-type region 5 and the floating diffusion region 3.

In the CCD image sensor, a photoelectric conversion of an incident light into an electric signal is performed in the photodiode N-type region 2 to generate a signal charge. The signal charge is introduced into the floating diffusion region 3 for amplification after horizontally traversing the P-type well region 6 through the photodiode surface P-type region 5. Thereafter, the amplified signal charge is converted into a voltage signal, and the CCD image sensor outputs the voltage signal.

Generally, the gate electrode 1 is overlapped with the floating diffusion region 3, and is made of doped polycrystalline silicon.

In case the photoelectric conversion of the incident light into the electric signal is performed in the photodiode N-type region 2 to generate the signal charge, an electron is generally used as the signal charge in consideration of a transfer rate.

Further, to maximize a transfer efficiency of the signal charge, the floating diffusion region 3 is usually doped with an N-type impurity.

The oxide film 4 formed upon the semiconductor substrate 7 is a layer for protecting and simultaneously insulating the semiconductor substrate 7, which is generally made of silicon dioxide ($SiO_2$).

The photodiode surface P-type region 5 is disposed on an upper portion of the photodiode N-type region 2 to prevent an appearance of the electrons easily generated and dissipated at a low potential due to an electronic defect on a surface of the semiconductor substrate 7.

Since a voltage value in the photodiode of the CCD image sensor is about 3 volts, the signal charge remains within the photodiode of the CCD image sensor. Therefore, to discharge these excess charges, an N-type semiconductor substrate is disposed below a lower portion of the P-type well region 6.

As described above, in case of the CCD image sensor, the photodiode surface P-type region 5 as a p-channel should be injected into an upper portion of the photodiode so as to remove an internal noise, and the P-type well region 6 as well as an n-channel based semiconductor substrate should be included so as to discharge the excess charges. As a result, the CCD image sensor has a problem that the manufacturing process and structure of the CCD image sensor become complicated.

FIG. 2 is a cross-sectional view showing a structure of a unit pixel in a conventional CMOS image sensor.

Referring to FIG. 2, the unit pixel of the CMOS image sensor includes: an oxide film 4 formed upon a semiconductor substrate 8; a photodiode N-type region 2 formed within the semiconductor substrate 8 at a predetermined depth; a photodiode surface P-type region 5 disposed on the photodiode N-type region 2 and having an interface with the oxide film 4; a floating diffusion region 3 disposed within the semiconductor substrate 8 and having an interface with the oxide film 4, which is spaced apart from the photodiode surface P-type region 5 by a predetermined distance; and a gate electrode 1 disposed upon the semiconductor substrate between the floating diffusion region 3 and the photodiode regions 2 and 5.

In the CMOS image sensor, a photoelectric conversion of an incident light into an electric signal is performed in the photodiode N-type region 2 to generate a signal charge. The signal charge is introduced into the floating diffusion region 3 through the photodiode surface P-type region 5 for amplification. Then, the amplified signal charge is converted into a voltage signal, and the CMOS image sensor outputs the voltage signal.

Generally, the gate electrode 1 is aligned with the floating diffusion region 3 and the photodiode regions 2 and 5, which is made of doped polycrystalline silicon.

The alignment of the gate electrode 1 with the floating diffusion region 3 and the photodiode regions 2 and 5 means that a region of the gate electrode 1 is not overlapped with that of the photodiode regions 2 and 5.

In case the photoelectric conversion of the incident light into the electric signal is performed in the photodiode N-type region 2 to generate the signal charge, an electron is generally used as the signal charge in consideration of a transfer rate.

Further, to maximize a transfer efficiency of the signal charge, the floating diffusion region 3 is usually doped with an N-type impurity.

The oxide film 4 formed upon the semiconductor substrate 7 is a layer for protecting and simultaneously insulating the semiconductor substrate 7, which is generally made of silicon dioxide ($SiO_2$).

The photodiode surface P-type region 5 is disposed on an upper portion of the photodiode N-type region 2 to remove a noise caused by a depletion region of the photodiode and a heat noise caused by a recombination of electrons generated on a surface of the photodiode region or a movement of electrons to the photodiode N-type region 2.

Since a voltage value in the photodiode of the CMOS image sensor is about 1 volt, there exists no signal charge within the photodiode of the CMOS image sensor. Therefore, unlike the CCD image sensor, a well region for discharging excess charges is not needed, so that a P-type semiconductor substrate is provided and an additional well region need not be formed thereon.

As described above, in case of the CMOS image sensor, the photodiode P-type region 5 as p-channel should be injected into an upper portion of the photodiode so as to remove an internal noise. Thus, CMOS image sensor also has a problem that the manufacturing process and structure of the CMOS image sensor becomes complicated.

Further, although research and development for minimizing a leakage noise or a heat noise generated in the CCD or CMOS image sensor have been steadily carried out, the leakage noise or the heat noise is not reduced to a desired level.

SUMMARY OF THE INVENTION

The present invention solves the problems of the prior art, and provides an image sensor with improved productivity and sensitivity.

This object, other incidental ends and advantages of the invention will hereinafter appear in the progress of the disclosure and as pointed out in the appended claims.

According to one aspect of the invention, the present invention provides an image sensor comprising a plurality of unit pixels. Each unit pixel includes an oxide film formed upon a semiconductor substrate, a gate electrode formed on the oxide film, a photodiode N-type region formed within the semiconductor substrate and interfacing with the oxide film, the photodiode N-type region being spaced apart from the gate electrode by a predetermined distance and being disposed on one side of the gate electrode, and a floating diffusion region formed within the semiconductor substrate and interfacing with the oxide film, the $N^+$-type region being spaced apart from the gate electrode by a predetermined distance and being disposed on the other side of the gate electrode.

It is preferable that each unit pixel is isolated by an isolation region, which includes a P-type impurity region formed within the semiconductor substrate and having an interface with the oxide film, and a light shielding layer disposed on an upper portion of the P-type impurity region, which is formed of opaque insulating material. More preferably, the shielding layer is made of silicon dioxide ($SiO_2$).

Since the image sensor of the present invention requires less masks than a conventional image sensor in the wafer foundry, the production cost will be reduced. Further, as a process of injecting the P-type impurity is not needed, the manufacturing process is simplified and the productivity is improved.

Furthermore, since a leakage noise or a heat noise can be remarkably reduced while keeping a constant aperture ratio, the sensitivity is improved.

BRIEF DESCRIPTION OF THE DRAWINGS

These and other features, aspects, and advantages of the present invention will become better understood with regard to the following description, appended claims, and accompanying drawings, in which like components are referred to by like reference numerals. In the drawings:

DETAILED DESCRIPTION OF PREFERRED EMBODIMENT

Hereinafter, preferred embodiments of the present invention will be described in detail with reference to the accompanying drawings.

Figure 3:
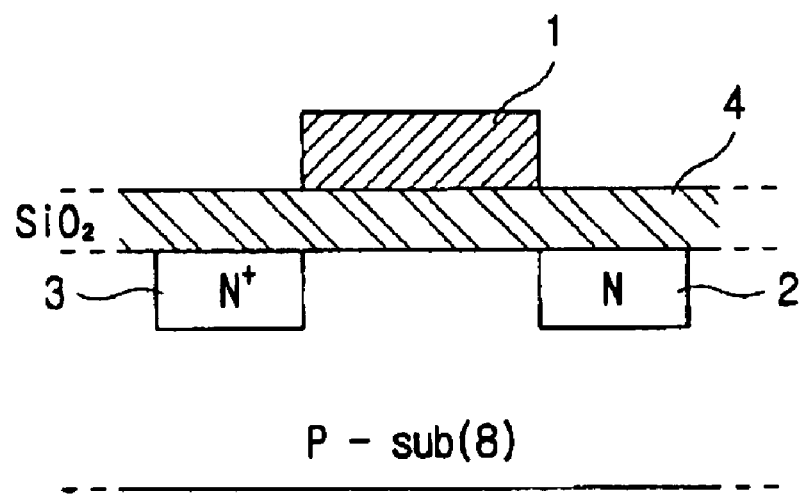
FIG. 3 is a cross-sectional view showing a structure of a unit pixel in an NMOS image sensor in accordance with a preferred embodiment of the present invention.

FIG. 3 is a cross-sectional view showing a structure of a unit pixel in an NMOS image sensor in accordance with a preferred embodiment of the present invention.

Referring to FIG. 3, the unit pixel of the image sensor in accordance with the present invention includes: an oxide film 4 formed upon a semiconductor substrate 8; a gate electrode 1 formed on the oxide film 4; a photodiode N-type region 2 formed within the semiconductor substrate 8 and having an interface with the oxide film 4, which is spaced apart from the gate electrode 1 by a predetermined distance and disposed on one side of the gate electrode 1; and an $N^+$-type region 3 acting as a floating diffusion region, formed within the semiconductor substrate 8 and having an interface with the oxide film 4, which is spaced apart from the gate electrode 1 by a predetermined distance and disposed on the other side of the gate electrode 1.

In the NMOS image sensor, a photoelectric conversion of an incident light into an electric signal is performed in the photodiode N-type region 2 to generate a signal charge. The signal charge is amplified in the floating diffusion region 3 to be converted into a voltage signal, and the NMOS image sensor outputs the voltage signal.

Generally, the gate electrode 1 is aligned with the floating diffusion region 3 and the photodiode N-type region 2, which is made of doped polycrystalline silicon.

The alignment of the gate electrode 1 with the floating diffusion region 3 and the photodiode N-type region 2 means that a region of the gate electrode 1 is not overlapped with that of the photodiode N-type region 2.

In case the photoelectric conversion of the incident light into the electric signal is performed in the photodiode N-type region 2 to generate the signal charge, an electron is generally used as the signal charge in consideration of a transfer rate.

Further, to maximize a transfer efficiency of the signal charge, the floating diffusion region 3 is usually doped with an N-type impurity.

The oxide film 4 formed upon the semiconductor substrate 8 is a layer for protecting and simultaneously insulating the semiconductor substrate 4, which is generally made of silicon dioxide ($SiO_2$).

As described above, since the unit pixel of the image sensor in accordance with the present invention has no impurity region corresponding to a photodiode surface P-type region, a process of injecting a P-type impurity is not needed to perform in a manufacturing process.

Also, the N-type impurity can be simultaneously injected into the photodiode N-type region 2 and the floating diffusion region 3, so that a manufacturing process is simplified and thus the productivity is remarkably improved.

Further, like the CMOS image sensor, a well region for discharging excess charges is not needed, so that the present invention has an advantage in the structure and manufacturing process that a P-type semiconductor substrate as well as an additional well region formed thereon is not needed.

Figure 4:
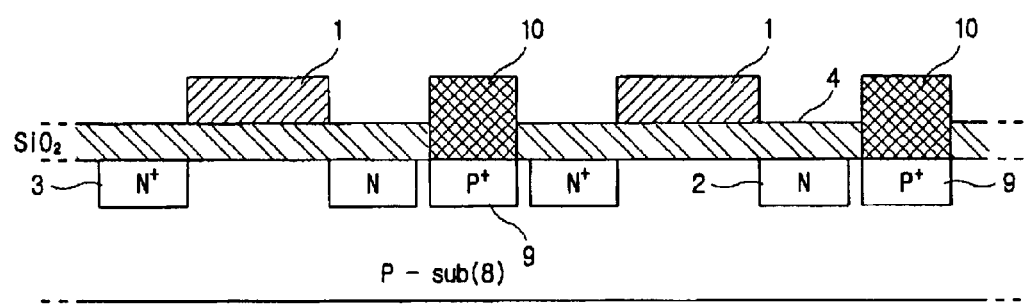
FIG. 4 is a cross-sectional view showing a structure of an NMOS image sensor in accordance with another preferred embodiment of the present invention.

FIG. 4 is a cross-sectional view showing a structure of an NMOS image sensor in accordance with another preferred embodiment of the present invention.

Referring to FIG. 4, the image sensor of the present invention includes an oxide film 4 formed upon a semiconductor substrate 8; a gate electrode 1 formed on the oxide film 4; a photodiode N-type region 2 formed within the semiconductor substrate 8 and having an interface with the oxide film 4, which is spaced apart from the gate electrode 1 by a predetermined distance and disposed on one side of the gate electrode 1; an N+-type region 3 acting as a floating diffusion region, formed within the semiconductor substrate 8 and having an interface with the oxide film 4, which is disposed spaced apart from the gate electrode 1 by a predetermined distance and disposed on the other side of the gate electrode 1; and an isolation region containing an impurity region 9 formed within the semiconductor substrate 8 and having an interface with the oxide film 4, and a light shielding layer 10 formed on the impurity region 9.

In this embodiment, an isolation region for preventing a noise due to a light diffusion and a signal transfer among adjacent pixels is formed through an impurity injection process, not local oxidation of silicon (LOCOS) process.

In other words, the isolation region includes the impurity region 9 that is formed within the semiconductor substrate and having an interface with the oxide film 4, and the light shielding layer 10 that is disposed on the impurity region 9 and made of an opaque insulating material.

The light shielding layer 10 is made of the opaque insulating material, preferably silicon dioxide ($SiO_2$).

Further, the impurity region 9 corresponding to a lower portion of the isolation region is made of a P-type impurity.

Figure 1:
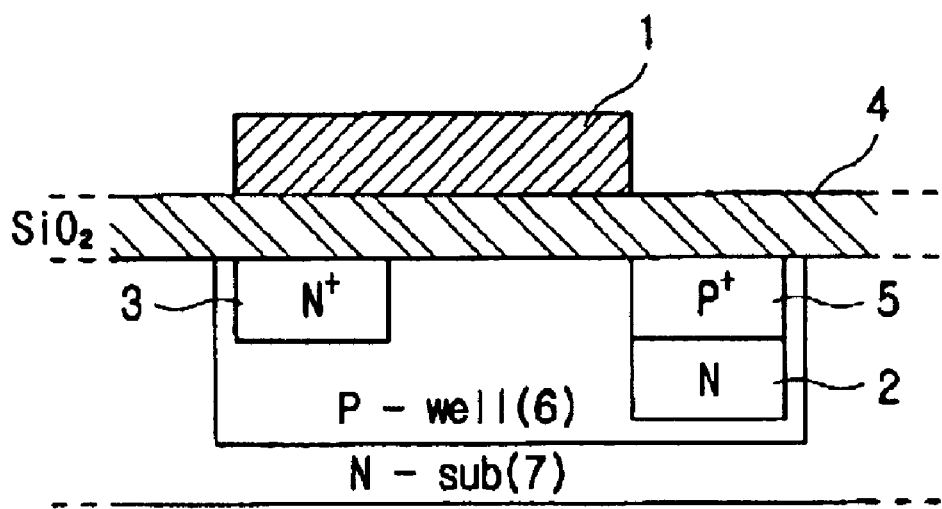
FIG. 1 is a cross-sectional view showing a structure of a unit pixel in a conventional CCD image sensor.
Figure 2:
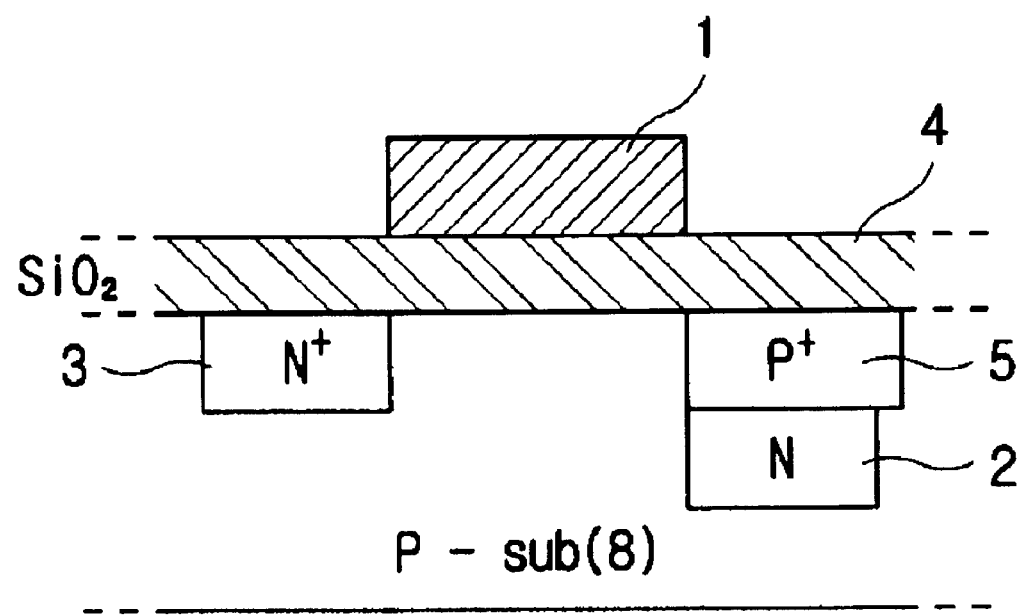
FIG. 2 is a cross-sectional view showing a structure of a unit pixel in a conventional CMOS image sensor.

Therefore, although there exists no photodiode surface P-type region 5 shown in FIGS. 1 and 2 for removing the internal noise and heat noise, the P-type impurity region 9 makes the internal noise and heat noise sufficiently removed.

Furthermore, a noise caused by a leakage current among the unit pixels can be sufficiently removed.

In manufacturing the image sensor, compared with the conventional CCD or CMOS image sensor that has a complicated structure and thus needs about 25 or about 15 masks in a wafer foundry respectively, the image sensor of the present invention has a simple structure and can be manufactured using 9 or less masks.

As a result, the image sensor of the present invention has great effect on reducing both the production cost and the manufacturing cost of masks.

Meanwhile, an aperture ratio of the image sensor in accordance with the present invention is about 60% similar to that of the CMOS image sensor. At this time, the aperture ration represents a sensitivity ratio with respect to the incident light. Compared with the CCD or CMOS image sensor, however, the image sensor of the present invention has a much lower value in the heat noise generated due to a recombination of electrons on a surface of the photodiode region or a movement of electrons to the photodiode N-type region.

Therefore, in view of the sensitivity determined by factors of the aperture ratio and the noise, the image sensor of the present invention has an improved sensitivity compared with the CCD or CMOS image sensor.

The image sensor according to the present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. An N-channel metal oxide semiconductor (NMOS) type image sensor comprising:

a plurality of unit pixel, each unit pixel comprising:

a P-type semiconductor substrate;

an oxide film provided on a surface portion of the P-type semiconductor substrate;

an N photodiode region formed to a predetermined depth in a surface portion of the P-type semiconductor substrate and interfacing with the oxide film;

an N+ region acting as a floating diffusion region formed to a predetermined depth in a surface portion of the P-type semiconductor substrate and being spaced apart from the N photodiode region;

a gate electrode provided on the oxide film and aligned with the floating diffusion region and the N photodiode region and an isolation area for respectively isolating the unit pixels from each other;

wherein the isolation area includes a P+ impurity region doped to a predetermined depth within a surface of the P-type semiconductor substrate corresponding to a boundary between the unit pixels, and a light shielding layer provided on an upper portion of the P+ impurity region and having an opaque insulating material.

* * * * *